United States Patent [19]

Blanchard et al.

[11] Patent Number: 4,949,218

[45] Date of Patent: Aug. 14, 1990

[54] CABINET WITH BUILT-IN COOLING SYSTEM

[75] Inventors: Joseph H. Blanchard, Richardson, Tex.; Earl C. Barb, Muncie, Ind.; Yasushi Kojima, Kawasaki, Japan

[73] Assignees: Fujitsu Limited, Kawasaki, Japan; Fujitsu America, Inc., San Jose, Calif.

[21] Appl. No.: 304,480

[22] Filed: Feb. 1, 1989

[51] Int. Cl.⁵ .............................. H05K 7/20
[52] U.S. Cl. ..................... 361/384; 165/104.33; 165/122; 312/236
[58] Field of Search .............. 312/223, 236; 62/418, 62/419; 174/15.1, 16.1, 16.3; 165/80.3, 122, 104.33, 104.34, 104.14; 361/379, 381, 382, 383, 384, 390

[56] References Cited

U.S. PATENT DOCUMENTS

| | | |
|---|---|---|
| 2,516,184 | 7/1950 | Christie . |
| 2,738,171 | 3/1956 | Walton . |
| 2,824,939 | 2/1958 | Claybourn et al. . |
| 2,986,377 | 5/1961 | Naab . |
| 3,006,166 | 10/1961 | Kronenberger .................. 62/418 |
| 3,292,688 | 12/1966 | Shrader . |
| 3,317,798 | 5/1967 | Chu et al. . |
| 3,396,780 | 8/1968 | Koltuniak et al. . |
| 3,402,762 | 9/1968 | Kreuter et al. . |
| 3,908,750 | 9/1975 | Siegel . |
| 4,103,737 | 8/1978 | Perkins . |
| 4,306,613 | 12/1981 | Christopher ................... 165/104.34 |
| 4,386,651 | 6/1983 | Reinhard . |
| 4,449,579 | 5/1984 | Miyazaki et al. . |
| 4,465,124 | 8/1984 | Jacquet et al. . |
| 4,485,429 | 11/1984 | Mittal ............................. 165/104.33 |
| 4,495,545 | 1/1985 | Dufresne ........................... 361/384 |
| 4,600,050 | 7/1986 | Noren ............................. 165/104.33 |
| 4,665,466 | 5/1987 | Green . |
| 4,688,626 | 8/1987 | Tengesdal . |
| 4,699,208 | 10/1987 | Wolf ..................................... 165/80.3 |
| 4,702,154 | 10/1987 | Dodson ............................... 165/122 |
| 4,777,560 | 10/1988 | Herrell ................................. 165/185 |

Primary Examiner—Gerald P. Tolin
Attorney, Agent, or Firm—Staas & Halsey

[57] ABSTRACT

A cabinet for housing electronic equipment includes an integrally formed cooling system which includes an air conduct running longitudianlly between the opposite end walls of the cabinet in an upper portion thereof. A cooling fin assembly is fitted into a lower wall of the air duct so as to have its fins extend upwardly into the air duct and downwardly into the cabinet. Heat transfer takes place as heat from within the cabinet passes to the cooling fins which are then cooled by a pair of fans disposed at opposite ends of the air duct.

21 Claims, 5 Drawing Sheets

CABINET WITH BUILT-IN COOLING SYSTEM

BACKGROUND OF THE INVENTION

1. Field of the Invention

The present invention relates generally to cabinets for housing electrical components and, more specifically, to cabinets equipped with cooling systems for removing internally generated heat.

2. Description of the Related Art

Customized cabinets for housing electrical components, such as telecommunications loop electronics equipment, are typically constructed by assembling parts made of sheet aluminum. One type of cabinet, known as a remote terminal cabinet, is mounted outdoors on a concrete pad and must be essentially sealed to keep out water. Concomitantly, the components housed in the cabinet produce heat in operation, thus necessitating a cooling system capable of removing heat from within the sealed cabinet. The dual requirements of sealing to protect interior components and cooling to remove heat generated by the interior components are difficult to reconcile since most existing cooling systems require penetration into the interior chamber of a cabinet, thus providing potential access for water.

An additional problem associated with known cooling systems is that most are provided as "add-on" features and thus do not integrate well with the rest of the cabinet to provide optimum cooling performance. Moreover, most require modifications to the cabinet in the form of access holes for a cooling air flow generated by cooling fans. The fans themselves tend to be difficult to service due to the fact that the add-on units tend to be as compact as possible.

A known add-on cooling unit is described with reference to FIG. 1, wherein the unit is generally referred to by the numeral 20. The unit 20 is connectable to a cabinet 22 by boring attachment holes 24 in the top surface 26 of the cabinet 22. Vents 28 and 30 are cut into the top surface 26 of the cabinet 22 to provide a vertical air flow as indicated by the directional arrows. Fans 30 force the air flow in one side of a unit, then downwardly into the cabinet 22 thereby forcing hot air upwardly as indicated by the directional arrow. The hot air passes over a cooling fin assembly 32 before being blown out of the unit 20. The cooling fin assembly 32 includes a coil which contains a cooling liquid.

The unit described with reference to FIG. 1 typifies the problems associated with the known cooling systems. One problem is that by locating the unit on top of the cabinet, an outdoor use is not practical since the unit tends to be unsheltered and can allow water to leak into the vents 28 and 30 and through the attachment holes 24. Also, the fans 30 will be exposed to the elements and will thus have a propensity towards water damage.

In the known systems, such as what is illustrated in FIG. 1, the fans 30 tend to be unaccessible for maintenance except by removing the entire unit. Thus, maintenance is impractical.

Finally, cooling units such as what is illustrated in FIG. 1 having a vertically oriented air flow tend to be less efficient coolers since the incoming and outgoing air currents are located in one portion of the cabinet and thereby provide uneven cooling.

SUMMARY OF THE INVENTION

An object of the present invention is to provide a cabinet for housing electronic equipment which has an integrally constructed cooling system.

Another object of the present invention is to provide a cabinet for housing electronic equipment in which cooling fans of an integrally constructed cooling system are easily accessible for maintenance.

Another object of the present invention is to provide a cabinet for housing electronic equipment which minimizes possible exposure of either the internal cabinet components or the cooling system components to the elements.

Yet another object of the present invention is to provide a cabinet for housing electronic equipment in which sufficient cooling capacity is achieved without requiring pipes or coils for a cooling fluid.

Another object of the present invention is to provide a cabinet for housing electronic equipment in which the cooling system components are housed within the cabinet, yet easily accessible for maintenance.

These and other objects of the invention are met by providing a cabinet for housing electronic equipment which includes a base for supporting the cabinet and being connectable to a pad, opposite longitudinal sidewalls and opposite lateral end walls upstanding from the base and forming an interior chamber for mounting electronic equipment capable of producing heat when operating, a top covering the opposite sidewalls and end walls, a pair of air vents disposed respectively in upper portions of the opposite end walls, an air duct disposed between the air vents in an upper portion of the cabinet above the interior chamber, heat exchange means disposed partially in the air duct and partially in the interior chamber for conducting heat generated by the electronic equipment to the air duct, and means for moving ambient air through the air duct thereby removing heat generated by the electronic equipment.

Preferably, the air duct includes a pair of diagonal plates respectively mounted at proximal ends thereof to the opposite end walls of the cabinet below the air vents and having distal ends extending towards the top of the cabinet, a longitudinal plate connected to and extending between the distal ends of the diagonal plates, the diagonal plates and the longitudinal plate forming a bottom wall of the air duct, a pair of opposite sidewalls extending downwardly from the top of the cabinet longitudinally between the opposite end walls of the cabinet to the bottom wall of the air duct, and a top wall formed by the top of the cabinet. The longitudinal plate has an opening formed therein for mounting the heat exchange means with an upper portion of the heat exchange means in the air duct and a lower portion in the interior chamber of the cabinet.

These objects, together with other objects and advantages which will be subsequently apparent reside in the details of construction and operation of the cabinet as more fully hereinafter described and claimed, reference being had to the accompanying drawings forming a part hereof, wherein like reference numerals refer to like parts throughout.

DETAILED DESCRIPTION OF THE PREFERRED EMBODIMENTS

Figure 1:
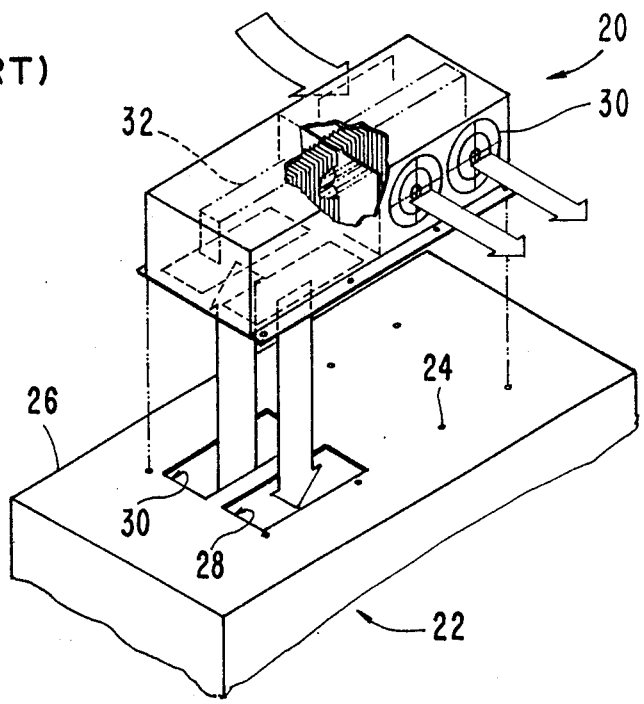
FIG. 1 is a partial exploded view showing a known cooling system.
Figure 2:
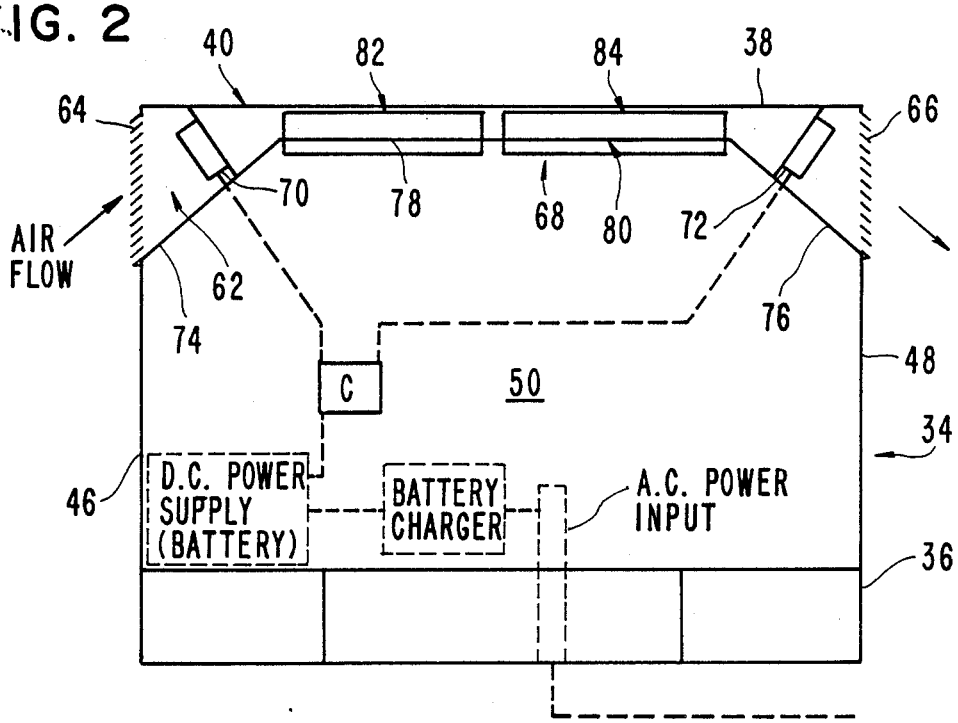
FIG. 2 is a schematic view of a cabinet for housing electronic equipment according to the present invention.

Referring to FIG. 2, a cabinet 34 according to the present invention is illustrated schematically as having a base portion 36 for supporting the cabinet on a concrete pad or other suitable platform. A top 38 covers opposite sidewalls and end walls 46 and 48 which are upstanding from the base portion 36 and thus form an interior chamber 50 for mounting electronic equipment capable of producing heat when operating. As an example, the cabinet 34, if used for housing loop electronics equipment, could be used to house six FDLC channel banks, a ring generator, a fault locate and orderwire panel, a fuse and alarm panel, a DC power system, and a surge protector. This equipment will allow from 192 to 1,152 VF telephone lines to be housed in a single cabinet. The cabinet is constructed preferably of one-eighth inch thick sheet aluminum with all exposed seams fully welded. A powder polyester paint is applied to the cabinet body and interior panels.

In FIG. 2, the upper portion of the cabinet 34 includes a cooling system 40 which is integrated into the cabinet. The various components of the cooling system 40, and further details of the cabinet 34 will now be explained with reference to FIGS. 2-9.

Figure 4:
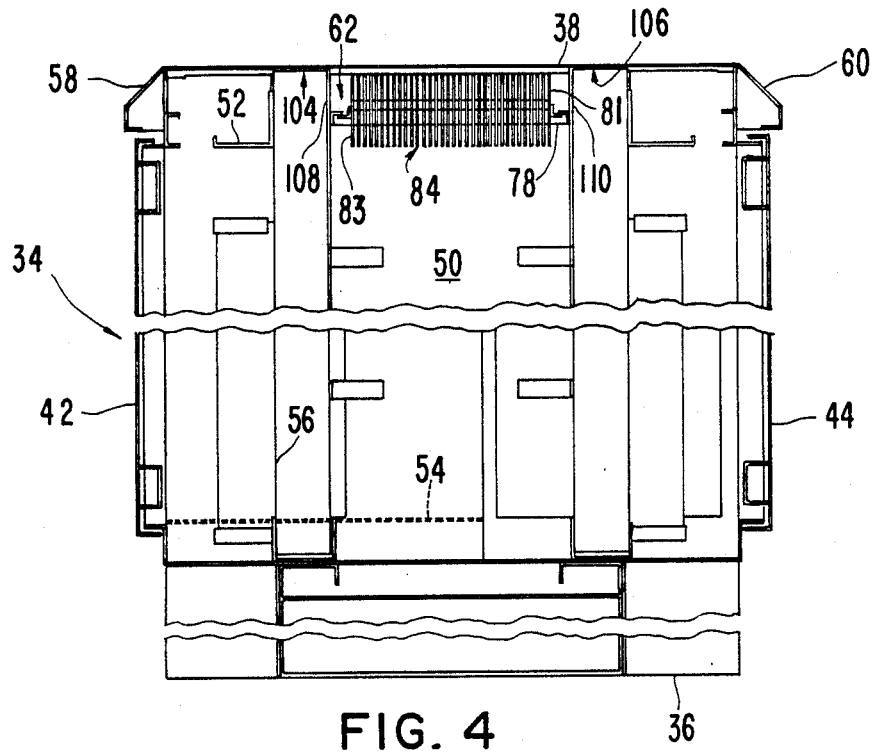
FIG. 4 is a cross-sectional view of the cabinet shown in FIG. 3.
Figure 3:
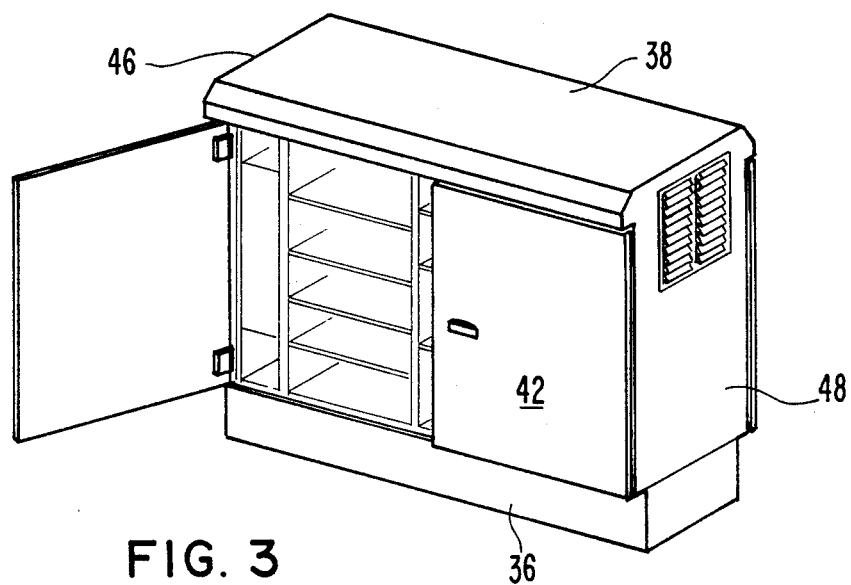
FIG. 3 is a perspective view of a preferred embodiment of cabinet for housing electronic equipment according to the present invention.

Referring to FIGS. 3 and 4, the cabinet includes a pair of opposite longitudinal sidewalls 42 and 44 which are upstanding from the base portion 36 along with opposite lateral end walls 46 and 48. The top 38 covers the opposite sidewalls 42 and 44 and the end walls 46 and 48 to thereby form an interior chamber 50 in which various types of electronics equipment capable of producing heat when operating are mounted. The cabinet illustrated in FIGS. 2-9 is about 86 inches long, 34 inches deep, and 66 inches tall including a 10 inch tall mounting base. The mounting base 36 has removable end covers for providing access to cables, AC power feed, and pad mounting bolts. Cable support racks 52 (FIG. 4), a battery shelf 54, and other mounting structures 56 are provided in the interior chamber 50 for mounting various components within the cabinet 34.

The cabinet has double doors front and rear for equipment access. Thus, in FIG. 3 the sidewall 42 is actually a double-door attached to the cabinet body by a continuous stainless steel hinge (not shown) provided at the opposite longitudinal ends of the cabinet. The doors are latched by a three point latching system (not shown) that has a mechanical interlock and provisions for a padlock. The mechanical interlock device is self-locking and is operated by an allen wrench.

The cabinet is completely sealed to prevent dust and moisture from entering the electronics area. The cabinet top 38 is specifically constructed to include overhanging portions 58 and 60 (FIG. 4) which extend beyond the opposite sidewalls 42 and 44 to prevent water from dripping into the interior chamber 50. Each of the overhanging portions forms a dead-air space on opposite sides of the top 38 which has the effect of increasing the surface area of the cabinet and thus the ability of the cabinet to dissipate heat. The overhanging portions 58 and 60 also tend to prevent water from dripping onto the equipment housed within the cabinet when the doors are open. A gasket is preferably provided around the doors to keep out wind driven snow, dust or rain.

The cooling system 40 is designed to keep the internal temperature below a certain temperature. For the illustrated and described loop electronics equipment cabinet, the internal temperature is preferably kept below 65° C. The cooling system, as schematically represented in FIG. 2, includes an air duct 62 which extends from one of the lateral ends of the cabinet 34 to the other between a pair of air vents 64 and 66 provided in upper portions of the opposite end walls 46 and 48. Heat exchange means 68 are disposed partially in the air duct 62 and partially in the interior chamber 50 in order to conduct heat generated by the electronic equipment to the air duct. Fans 70 and 72 are mounted in opposite end portions of the air duct 62 induce an air flow through the air duct according to the directional arrows.

The heat exchange means 68 and the top 38 of the cabinet 34 form part of the air duct 62. More specifically, a pair of diagonal plates 74 and 76 respectively mounted at proximal ends thereof to the opposite end walls 46 and 48 of the cabinet 34 below the air vents 64 and 66 have distal ends which extend towards the top 38 of the cabinet. A longitudinal divider plate 78 is connected to and extends between the distal ends of the diagonal plates 74 and 76. The diagonal plates 74 and 76 and the longitudinal divider plate 78 form a bottom wall 80 of the air duct 62 which extends from one opposite end wall 46 to the other end wall 48.

The longitudinal divider plate 78 is provided with openings which accommodate a pair of cooling fin assemblies 82 and 84 as shown schematically in FIG. 2.

Referring to FIG. 4, a cooling fin assembly 84 is shown mounted in the longitudinal divider plate 78. An upper portion 81 of the cooling fin assembly 84 extends into the air duct 62, while a lower portion 83 extends downwardly into the interior chamber 50.

Figure 5:
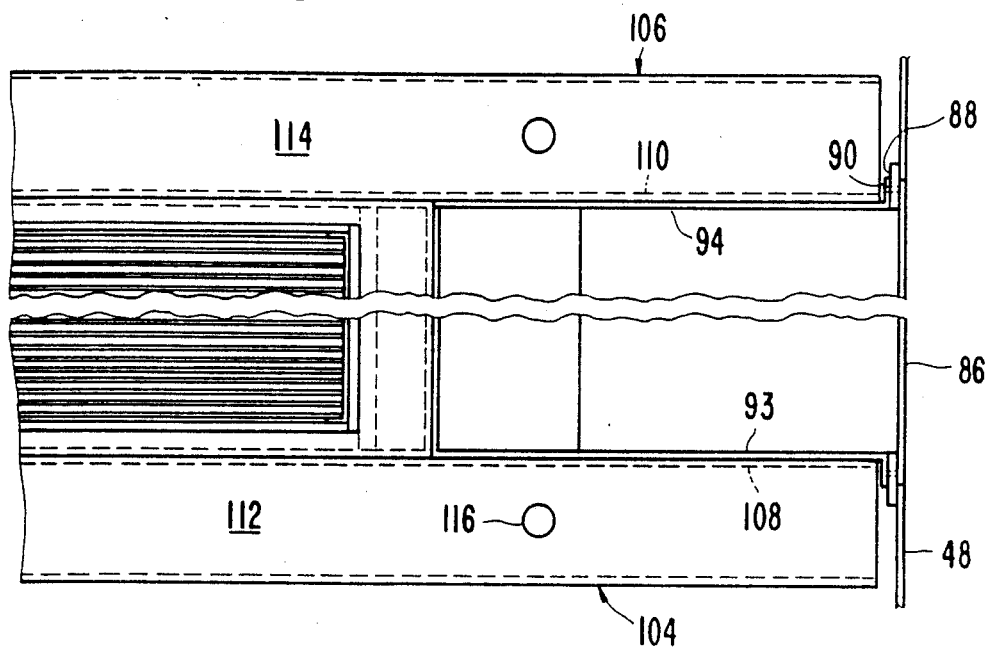
FIG. 5 is a partial plan view of a portion of the cooling fan assembly incorporated in the cabinet of FIG. 3.
Figure 6:
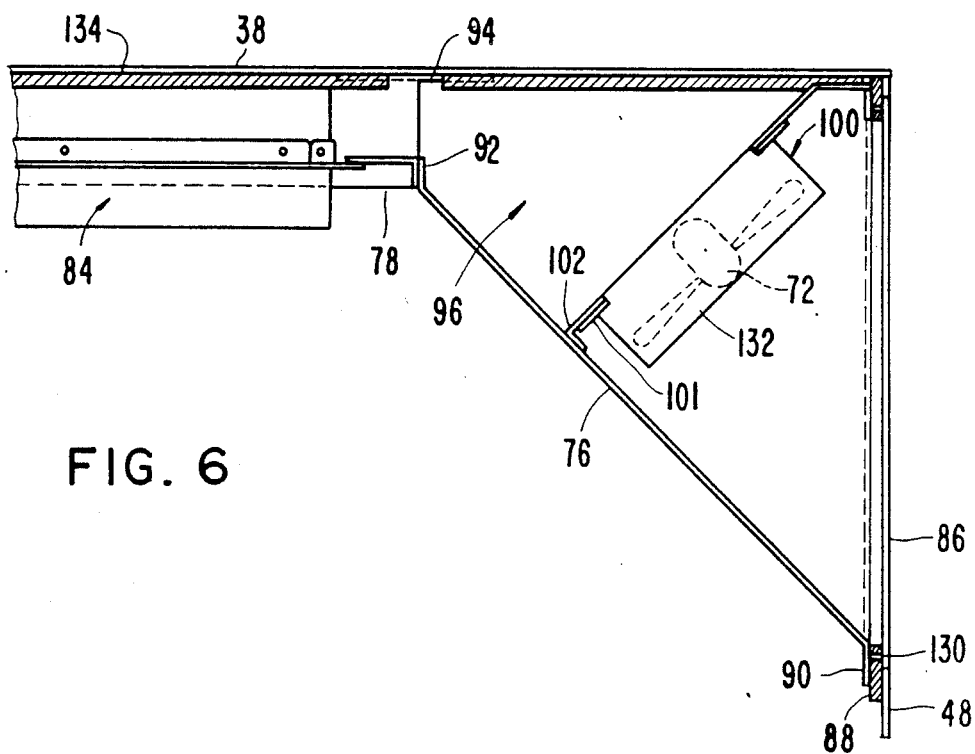
FIG. 6 is a side elevational view essentially of the structure illustrated in FIG. 5, with the top of the cabinet, the fan and supporting structure included.

Referring to FIGS. 5 and 6, one end portion of the cooling system is illustrated in greater detail. The end wall 48 is provided with a vent opening 86 which receives a screened and louvered vent cover (not shown). The diagonal plate 76 is connected to a support plate 88 which surrounds the vent opening 86. The diagonal plate 76 has a flange 90 for connecting the diagonal plate to the support plate 88. Additionally, a flange 92 at the opposite end permits connection of the diagonal plate to the longitudinal partition plate 78. Opposite side walls 93 and 94 extend upwardly from the diagonal plate 76 and extend to the top 38 of the cabinet. Thus, the diagonal plate 76, the opposite sidewalls 93 and 94 and the corresponding portion of the top 38 of the cabinet form an enlarged portion 96 of the air duct. An identical mirror-image structure is provided at the opposite end of the air duct.

The opposite end enlarged portions of the air duct are provided to permit mounting of the fans 70 and 72. Fan 72 is mounted in a housing 100 which is supported on the diagonal plate 76 by a mounting plate 102. By mounting the fan 72 (and the opposite end fan 70) in an angled position relative to the main portion of the air duct which includes the cooling fin assemblies, a larger diameter fan, relative to the height of the main, longitudinal portion of the air duct, can be used to thereby increase air flow and cooling capacity. Moreover, accessibility for maintenance is enhanced.

The base portion 101 of the fan housing 100 is connectable to the mounting plate 102 by any conventional means such as threaded fasteners, rivets, welding, etc. A band portion 132 of the fan housing 100 is formed on the base plate 101. A self-contained fan unit, which includes a rotatable bladed member and a drive motor, may be fitted into the band portion 132.

Beams 104 and 106 are provided on opposite sides of the air duct and have sidewalls 108 and 110 which provide the sidewalls for the air duct 62. Opposite end portions of the beam sidewalls 108 and 110 overlap with opposite sidewalls 93 and 94, respectively, to provide a continuous sidewall from one end of the air duct to the other. The overlap may be eliminated, however. Top walls 112 and 114 of the beams 104 and 106, respectively, are connected to the top 38 of the cabinet. Holes 116 are provided in the top walls 112 and 114 for receiving eye bolts which extend through the top and through the holes 116. The eye bolts (not shown) can be used to lift the cabinet for positioning the same on its pad prior to mounting thereto. After achieving the proper position, the eye bolts can be removed for aesthetic purposes or can be left in place. If removed, plugs or covers would be provided for the corresponding holes in the top of the cabinet.

Referring again to FIG. 4, since the inner sidewalls 108 and 110 of the beams 104 and 106 extend downwardly only to the extent of the divider plate 78, the entire cross-sectional area of the interior chamber below the divider plate 78 is in communication with the lower portion 83 of the cooling fin assembly 84. Thus, heat generated within the cabinet in any particular area of the cabinet will be communicated to the lower portions of the two cooling fin assemblies.

Figure 7:
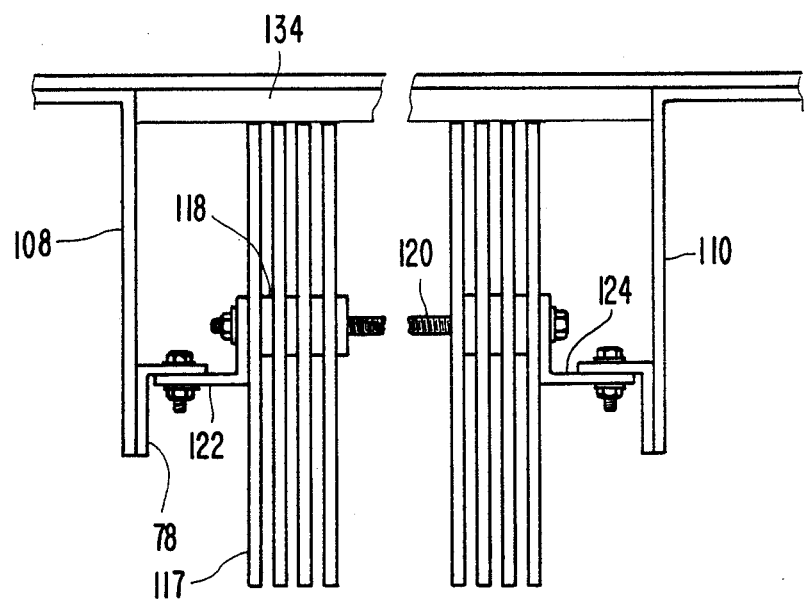
FIG. 7 is an enlarged view of the cooling fin assembly illustrated in FIG. 4.
Figure 8:
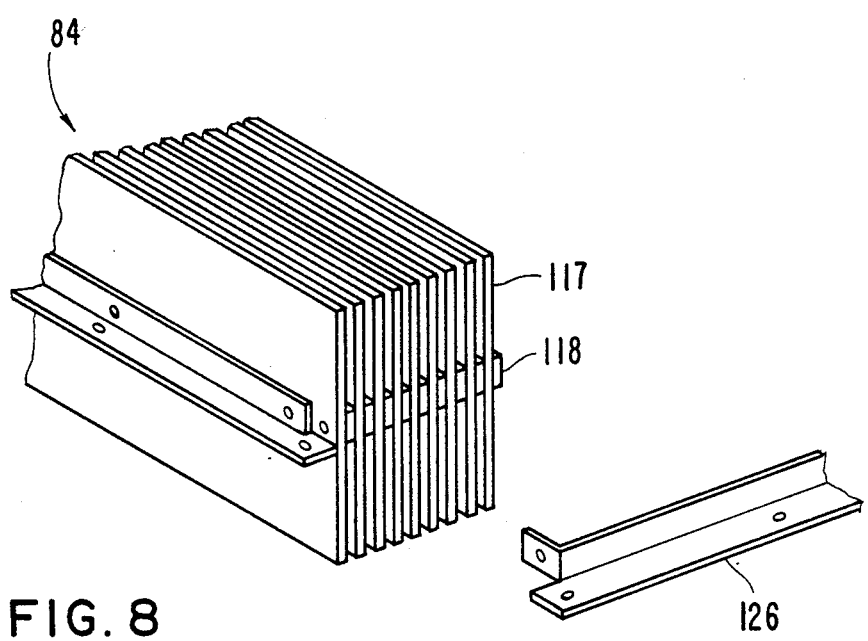
FIG. 8 is a perspective view, partially exploded, of the cooling fin assembly illustrated in FIG. 7.

Referring now to FIGS. 7 and 8, details of a cooling fin assembly 84 are shown. The assembly includes a plurality of fins 117 which are spaced apart by spacer bars 118. The portion of the fins 117 above the spacer bars 118 constitutes the upper portion of the cooling fin assembly which extends into the air duct, while the portion extending downwardly below the spacer bars 118 constitutes the lower portion of the cooling fin assembly. The fins 117 and spacer bars 118 are assembled by aligning bores provided therethrough at spaced intervals and passing a threaded rod 120 therethrough. The threaded rod 120 has a headed end and an opposite end which receives a threaded nut. Angle bars 122 and 124 are also provided with bores on a vertical portion thereof for receiving the threaded rod 120. To assemble the fin assembly, the fins 117 and spacer bars 118 are alternatingly stacked with the angle bars 122 and 124 at opposite ends of the stack. Then, the threaded rods 120 are passed through the aligned bores of the stacked elements and nuts are placed on the ends of the rods opposite the headed ends so as to threadedly engage the threaded rod and draw the various components tightly together. Since the spacer bars 118 extend the full length of the fins 117, a solid wall is created at the spacer bars 118 between the upper and lower portions of the fins. This wall becomes an integral part of the bottom of the air duct when assembled in the openings provided in the divider plate 78. The horizontal portions of the divider plate 78 and the angle bars 122 and 124 can be connected by any suitable means such as threaded fasteners, rivets, or welding.

An end angle bar 126 is bolted or otherwise connected to the opposite axial ends of the fins 117 and spacer bars 118 to provide means for attaching the cooling fin assembly to the partition plate 78. The partition plate 78 is itself connectable to the sidewalls 108 and 110 of the beams 104 and 106. Also, the opposite ends of the partition plate are connected to the flange 92 of the diagonal plate 76.

Two fin assemblies as depicted in FIG. 2 are preferred, as opposed to one which extends the full length of the cabinet, since alignment of bores for the fins and spacer bars becomes more difficult with increasing length.

The spacer bars and fins of the fin assemblies are cut or stamped out of aluminum sheets. Alternatively, a structure substantially equivalent to that illustrated in the drawings can be cast from a mold as a one-piece body.

Figure 9:
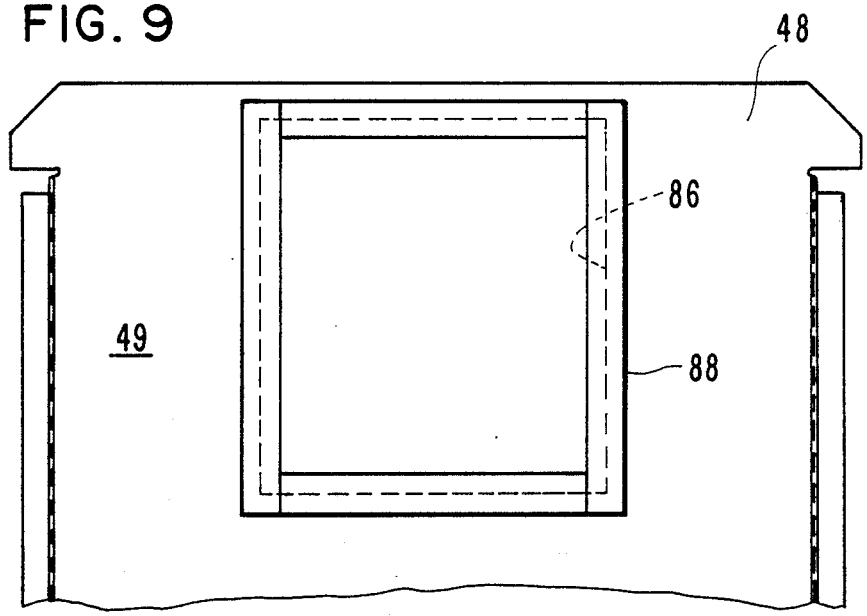
FIG. 9 is a partial reverse side elevational view of one end wall of the cabinet of FIG. 3.

FIG. 9 illustrates the inner surface 49 of the end wall 48. The vent opening 86 is illustrated as being substantially square, with the support plate 88 being centered thereon. The support plate 88 may be attached by welding or other suitable means.

Figure 10:
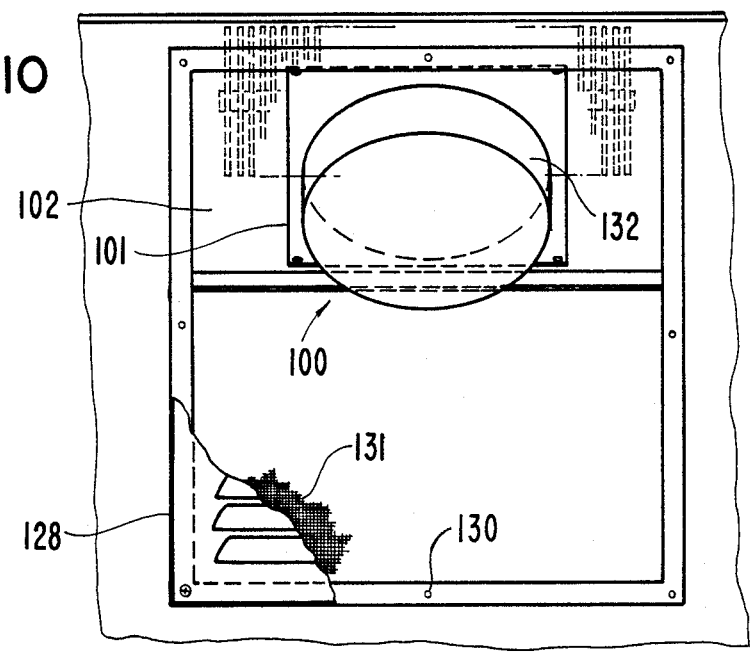
FIG. 10 is a side elevational view, partially cut-away, showing one of the louvered vents provided on opposite ends of the cabinet illustrated in FIG. 3.

FIG. 10 illustrates a louvered vent cover 128 which fits flush into the vent opening 86 and screws into bores 130 provided in the support plate 88. A screen 131 is provided either as a separate sheet attached to the back of the vent cover 128 or as an integrated part of the vent cover 128, wherein edges of the vent cover are bent over to edge portions of the screen 131 to thereby interconnect the screen to the cover.

The cooling system for the illustrated cabinet is designed to keep the internal temperature below 65° C. The cooling fin assemblies act as a heat transfer point to the outside air. Since the air duct 62 is sealed from the rest of the interior chamber, water and dust cannot enter the cabinet and cause damage to the components housed therein The fans which move external air through the air duct are located at the opposite end portions of the air duct and work in a complementary fashion, where one pulls and the other pushes air through the duct. The fans, for a cabinet having the dimensions previously described, are six inches in diameter, run on 48 volts (DC) and are thermostatically controlled to turn on at 50° C. and off at 40° C. To effect the thermostatic control, and referring to the schematic view of FIG. 2, the fans 70 and 72 are coupled to a controller C which includes integrated circuits and relays which provide a temperature sensing function and switches for switching on and off the fans depending on the sensed temperature. A DC power supply is coupled to the controller to provide electric power for the fans 70 and 72, and is recharged by a battery charger coupled to the A.C. power input.

The cabinet top is insulated with foil insulation, such as insulation layer 134 in FIGS. 6 and 7. A preferred type of insulation material is sold under the trademark REFLECTIX bubble-pack foil insulation with an R value of 9.2. The main purpose of the insulation is to reduce the heat gain from solar radiation. Secondary advantages of the insulation are to maintain an even internal temperature during cyclic or sudden changes in the outside air temperature. Also, the insulation provides protection for extreme cold conditions.

The battery shelf 54 illustrated in FIG. 4 may be provided with heaters for installations where extreme cold temperatures are to be encountered. The heaters (not shown) are connected to a 15 amp, 120 volt AC circuit and are thermostatically controlled to turn on at 0° C. and off at 15° C. The heaters are wirewound resistive elements vulcanized between sheets of neoprene rubber. Each heater is rated at about 225 watts and should be protected by a 4 amp fuse. The AC power supply is made available by the fact that cabinets of this type are normally provided with AC power systems made up of a 100 amp load center, circuit breakers, duplex outlets, and a voltage surge protector.

The many features and advantages of the present invention are apparent from the detailed specification, and thus, it is intended by the appended claims to cover all such features and advantages of the cabinets with built-in cooling system, which fall within the true spirit and scope of the invention. Further, since numerous modifications and changes will readily occur to those skilled in the art based upon the disclosure herein, it is not desired to limit the invention to the exact construction and operation illustrated and described. Accordingly, all suitable modifications and equivalents may be resorted to falling within the scope and the spirit of the invention.

We claim:

1. A cabinet housing electronic equipment comprising:
   a base portion supporting the cabinet and being connectable to a pad;
   opposite longitudinal sidewalls and opposite lateral end walls upstanding from the base portion and forming an interior chamber mounting the electronic equipment which is capable of producing heat when operating;
   a top covering the opposite sidewalls and end walls;
   a pair of air vents disposed respectively in upper portions of the opposite end walls;
   an air duct disposed between the air vents and being separated from an upper portion of the interior chamber by a bottom wall of the air duct which extends from one lateral end wall to the other;
   heat exchange means, disposed partially in the bottom wall of the air duct and partially in the interior chamber, for conducting heat generated by the electronic equipment to the air duct; and
   means for moving ambient air through the air duct, thereby removing heat generated by the electronic equipment.

2. A cabinet as claimed in claim 1, wherein the heat exchange means and the top of the cabinet form part of the air duct.

3. A cabinet as claimed in claim 1, wherein the heat exchange means comprises at least one cooling fin assembly mounted in the upper portion of the cabinet and having an upper portion disposed in the air duct and a lower portion disposed in the interior chamber.

4. A cabinet as claimed in claim 2, wherein the heat exchange means comprises at least one cooling fin assembly mounted in the upper portion of the cabinet and having an upper portion disposed in the air duct and a lower portion disposed in the interior chamber.

5. A cabinet as claimed in claim 1, wherein the air duct includes a pair of diagonal plates, each having a proximal end and a distal end, and each being respectively mounted at the proximal ends thereof to the opposite end walls of the cabinet below the air vents, the distal ends extending upwardly towards the top of the cabinet, a longitudinal divider plate substantially connected to and extending between the distal ends of the diagonal plates, the diagonal plates and the longitudinal divider plate forming a bottom wall of the air duct, a pair of opposite sidewalls extending downwardly from the top of the cabinet longitudinally between the opposite end walls of the cabinet to the bottom wall of the air duct, and a top wall formed by the top of the cabinet.

6. A cabinet as claimed in claim 5, wherein the heat exchange means is mounted on the longitudinal divider plate.

7. A cabinet as claimed in claim 6, wherein the longitudinal divider plate has at least one opening and the heat exchange means comprises at least one cooling fin assembly having a transverse portion mounted in the at least one opening of the longitudinal divider plate, an upper portion extending upwardly from the transverse portion into the air duct, and a lower portion extending downwardly from the transverse portion into the interior chamber of the cabinet.

8. A cabinet as claimed in claim 3, wherein each at least one cooling fin assembly comprises a plurality of elongated cooling fins and spacer bars alternatingly arranged to form a stack, two angle bars disposed on two opposite sides of the stack, the two angle bars, spacer bars and elongated cooling fins having aligned bores at spaced intervals receiving connecting rods.

9. A cabinet as claimed in claim 8, wherein the air duct includes a pair of diagonal plates, each having a proximal end and a distal end, and each being respectively mounted at the proximal ends thereof to the opposite end walls of the cabinet below the air vents, the distal ends extending upwardly towards the top of the cabinet, a longitudinal divider plate connected to and extending between the distal ends of the diagonal plates, the diagonal plates and the longitudinal divider plate substantially forming a bottom wall of the air duct, a pair of opposite sidewalls extending downwardly from the top of the cabinet longitudinally between the opposite end walls of the cabinet to the bottom wall of the air duct, and a top wall formed by the top of the cabinet.

10. A cabinet as claimed in claim 9, wherein the heat exchange means is mounted on the longitudinal divider plate.

11. A cabinet as claimed in claim 9, wherein the longitudinal divider plate has at least one opening and the at least one cooling fin assembly is received in the opening and connected to the longitudinal divider plate.

12. A cabinet as recited in claim 1, wherein the moving means comprises a pair of fans disposed at opposite end portions of the air duct, and cooperating with each other to draw ambient air in one vent, out the other and over the heat exchange means.

13. A cabinet as claimed in claim 1, further comprising control means coupled to a pair of fans for sensing internal cabinet temperature and operating the pair of fans in response to sensed internal cabinet temperature.

14. A cabinet as claimed in claim 13, wherein the air duct includes a pair of diagonal plates, each having a proximal end and a distal end, and each being respectively mounted at the proximal ends thereof to the opposite end walls of the cabinet below the air vents, the distal ends extending upwardly towards the top of the cabinet, a longitudinal divider plate connected to and extending between the distal ends of the diagonal plates, the diagonal plates and the longitudinal divider plate substantially forming a bottom wall of the air duct, a pair of opposite sidewalls extending downwardly from the top of the cabinet longitudinally between the opposite end walls of the cabinet to the bottom wall of the air duct, and a top wall formed by the top of the cabinet.

15. A cabinet as recited in claim 14, further comprising first and second support plates, each respectively connected orthogonally to one of the diagonal plates, each fan being mounted to one of the first and second support plates.

16. A cabinet as recited in claim 1, further comprising sheets of insulation disposed on an inner surface of at least the top of the cabinet.

17. A cabinet as recited in claim 1, wherein the pair of air vents comprises first and second openings provided respectively in the opposite lateral end walls, and first and second louvered vent covers fitted over the first and second openings, each vent cover having a screen disposed on an inner surface thereof.

18. A cabinet having opposite end walls, opposite sidewalls, and a top forming an interior housing electronic equipment which produces heat while operating, comprising:
   an air duct disposed in an upper portion of the interior of the cabinet and having a top wall, bottom wall, two opposite sidewalls, an inlet vent disposed in one end wall of the cabinet and an outlet vent disposed in the opposite end wall, the bottom wall separating the air duct from the remainder of the interior of the cabinet;
   heat exchange means disposed partially in the air duct above the bottom wall of the air duct and partially in the interior of cabinet below the air duct which conducts heat generated by the electronic equipment to the air duct; and
   means for moving ambient air through the air duct, thereby removing heat generated by the electronic equipment.

19. A cabinet as claimed in claim 18, wherein the heat exchange means is mounted in the bottom wall of the air duct.

20. A cabinet as claimed in claim 19, wherein the heat exchange means comprises at least one cooling fin assembly having a plurality of elongated cooling fins spaced apart and mounted longitudinally in at least one opening provided in the bottom wall of the air duct so that an upper portion of the elongated cooling fins extends upwardly into the air duct and a lower portion of the elongated cooling fins extends downwardly into the interior of the cabinet below the bottom wall of the air duct, the cooling fin assembly having a transverse portion which closes the at least one opening provided in the bottom wall of the air duct.

21. A cabinet housing electronic equipment comprising:
   a base portion supporting the cabinet and being connectable to a pad;
   opposite longitudinal sidewalls and opposite lateral end walls upstanding from the base portion and forming an interior chamber mounting electronic equipment capable of producing heat when operating;
   a top covering the opposite sidewalls and end walls;
   a pair of air vents disposed respectively in an upper portions of the opposite end walls;
   an air duct disposed between the air vents in upper portion of the cabinet above the interior chamber;
   heat exchange means, disposed partially in the air duct and partially in the interior chamber, for conducting heat generated by the electronic equipment to the air duct; and
   means for moving ambient air through the air duct, thereby removing heat generated by the electronic equipment;
   wherein the air duct includes a pair of diagonal plates, each having a proximal end and distal end, and each being respectively mounted at the proximal ends thereof to the opposite end walls of the cabinet below the air vents, the distal ends extending upwardly towards the top of the cabinet, a longitudinal divider plate substantially connected to and extending between the distal ends of the diagonal plates, the diagonal plates and the longitudinal divider plate forming a bottom wall of the air duct, a pair of opposite sidewalls extending downwardly from the top of the cabinet longitudinally between the opposite end walls of the cabinet to the bottom wall of the air duct, and a top wall formed by the top of the cabinet.

* * * * *